(12) United States Patent
Kolsrud et al.

(10) Patent No.: US 6,515,599 B1
(45) Date of Patent: Feb. 4, 2003

(54) HIGH-POWER SELECTIVE SIGNAL ATTENUATOR AND METHOD OF ATTENUATION

(75) Inventors: Arild Kolsrud, Bridgewater, NJ (US); Christopher F. Zappala, Annandale, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/533,109

(22) Filed: Mar. 22, 2000

(51) Int. Cl.7 ................................................ H03M 1/06
(52) U.S. Cl. ......................... 341/118; 341/155; 341/144
(58) Field of Search ................................. 341/118, 134, 341/110, 120, 136, 155, 144, 156, 139, 131; 455/450, 422, 437, 509, 249.1; 375/220

(56) References Cited

U.S. PATENT DOCUMENTS

| | | | |
|---|---|---|---|
| 3,600,204 A | | 8/1971 | Beall et al. |
| 3,756,798 A | | 9/1973 | Ernsenberger et al. |
| 3,907,535 A | | 9/1975 | Muller |
| 4,209,229 A | | 6/1980 | Rittler |
| 4,227,183 A | * | 10/1980 | Ninomiya .................... 341/155 |
| 4,397,670 A | | 8/1983 | Beall |
| 4,539,566 A | * | 9/1985 | Sharpe et al. ................ 455/306 |
| 4,709,215 A | * | 11/1987 | McClanahan et al. ......... 330/43 |
| 4,812,846 A | * | 3/1989 | Noro ........................... 341/131 |
| 5,042,898 A | | 8/1991 | Morey et al. |
| 5,186,729 A | | 2/1993 | Brown et al. |
| 5,252,973 A | * | 10/1993 | Masuda ........................ 341/131 |
| 5,392,042 A | * | 2/1995 | Pellon ......................... 341/143 |
| 5,392,463 A | * | 2/1995 | Yamada ......................... 455/93 |
| 5,555,272 A | * | 9/1996 | Balestro et al. ........... 455/249.1 |
| 5,630,221 A | * | 5/1997 | Birleson ....................... 375/220 |
| 5,673,044 A | * | 9/1997 | Pellon ......................... 341/143 |
| 5,768,694 A | * | 6/1998 | Kumagai ....................... 455/126 |
| 5,777,568 A | * | 7/1998 | Inoue .......................... 341/138 |
| 5,877,653 A | * | 3/1999 | Kim et al. .................... 330/149 |
| 5,986,500 A | * | 11/1999 | Park et al. ................. 330/124 D |
| 6,151,373 A | * | 11/2000 | Dodley ........................ 375/348 |
| 6,317,065 B1 | * | 11/2001 | Raeigh et al. ............... 341/139 |

FOREIGN PATENT DOCUMENTS

EP 0812810 12/1997

OTHER PUBLICATIONS

Analog Devices, Inc., "12–Bit, 65MSPS IF Sampling A/D Converter", AD6640, 1998.

* cited by examiner

*Primary Examiner*—Peguy JeanPierre
*Assistant Examiner*—Jean Bruner Jeanglaude
(74) *Attorney, Agent, or Firm*—Harness, Dickey & Pierce, P.L.C.

(57) ABSTRACT

The high-power selective signal attenuator includes an attenuator attenuating analog main signals, and a first analog-to-digital converter converting output of the attenuator to digital. A digital-to-analog converter reconverts the digital output of the first ADC to analog, and a cancellor receives the main signals and the analog output from the DAC. The cancellor cancels the analog output of the DAC from the main signals to substantially eliminate high-power signals. A second ADC receives the output of the cancellor and generates a digital output. Based on the digital output, control circuitry dynamically controls the attenuation of the attenuator to prevent saturation of the second ADC and to improve information throughput.

19 Claims, 2 Drawing Sheets

HIGH-POWER SELECTIVE SIGNAL ATTENUATOR AND METHOD OF ATTENUATION

BACKGROUND OF THE INVENTION

1. Field of the Invention

The present invention relates to signal attenuation; and more particularly, a high power selective signal attenuator and method of attenuation.

2. Description of Related Art

Analog-to-digital converters (ADCs) have a dynamic range of operation. The dynamic range is defined as the range from a minimum signal amplitude to a maximum signal amplitude (i.e., between a minimum and maximum power level). Analog signals having amplitudes within the dynamic range of an ADC will be converted from analog to digital.

Analog signals having amplitudes below the minimum power level of the dynamic range will not undergo conversion, while analog signals having amplitudes greater than the maximum power level of the dynamic range will overload or saturate the ADC. More specifically, the ADC will clip the amplitude of an analog signal having an amplitude greater than the maximum power level of the ADC's dynamic range. Clipping the amplitude of the analog signal causes harmonics which distort and corrupt the whole spectrum such that most signals are virtually lost. Consequently, such ADCs are unsuitable for many of today's communication needs.

SUMMARY OF THE INVENTION

The high-power selective signal attenuator according to the present invention isolates high-power signals in the received analog signal spectrum. The isolated high-power signals are then recombined with the received analog signals such that the high-power signals are substantially canceled from the received analog signals. The isolation of the high-power signals is accomplished by coupling the received analog signals onto a feed forward pathway, and attenuating the coupled signals so that high-power signals fall within the dynamic range of an ADC receiving the attenuator's output. Because the ADC performs the analog-to-digital conversion operation on signals falling within its dynamic range, the output of the ADC substantially represents the high-power signals in the received signals. The digital signals are then digital-to-analog converted and amplified by an amplifier, which compensates for the attenuation caused by at least the attenuator. The resulting signals are then combined 180° out of phase with the received analog signals so that the high-power signals are substantially canceled from the received analog signals.

The attenuation performed by the attenuator in the high-power selective signal attenuator is dynamically controlled by monitoring the output of a primary ADC receiving the output of the high-power selective signal attenuator. As the primary ADC approaches saturation, the attenuation level is increased. As the primary ADC falls further from saturation, the attenuation level is decreased. In this way, the maximum amount of information can be converted by the primary ADC without placing the primary ADC in saturation.

BRIEF DESCRIPTION OF THE DRAWINGS

The present invention will become more fully understood from the detailed description given hereinbelow and the accompanying drawings which are given by way of illustration only, wherein like reference numerals designate corresponding parts in the various drawings, and wherein.

DETAILED DESCRIPTION OF THE PREFERRED EMBODIMENTS

Figure 1:
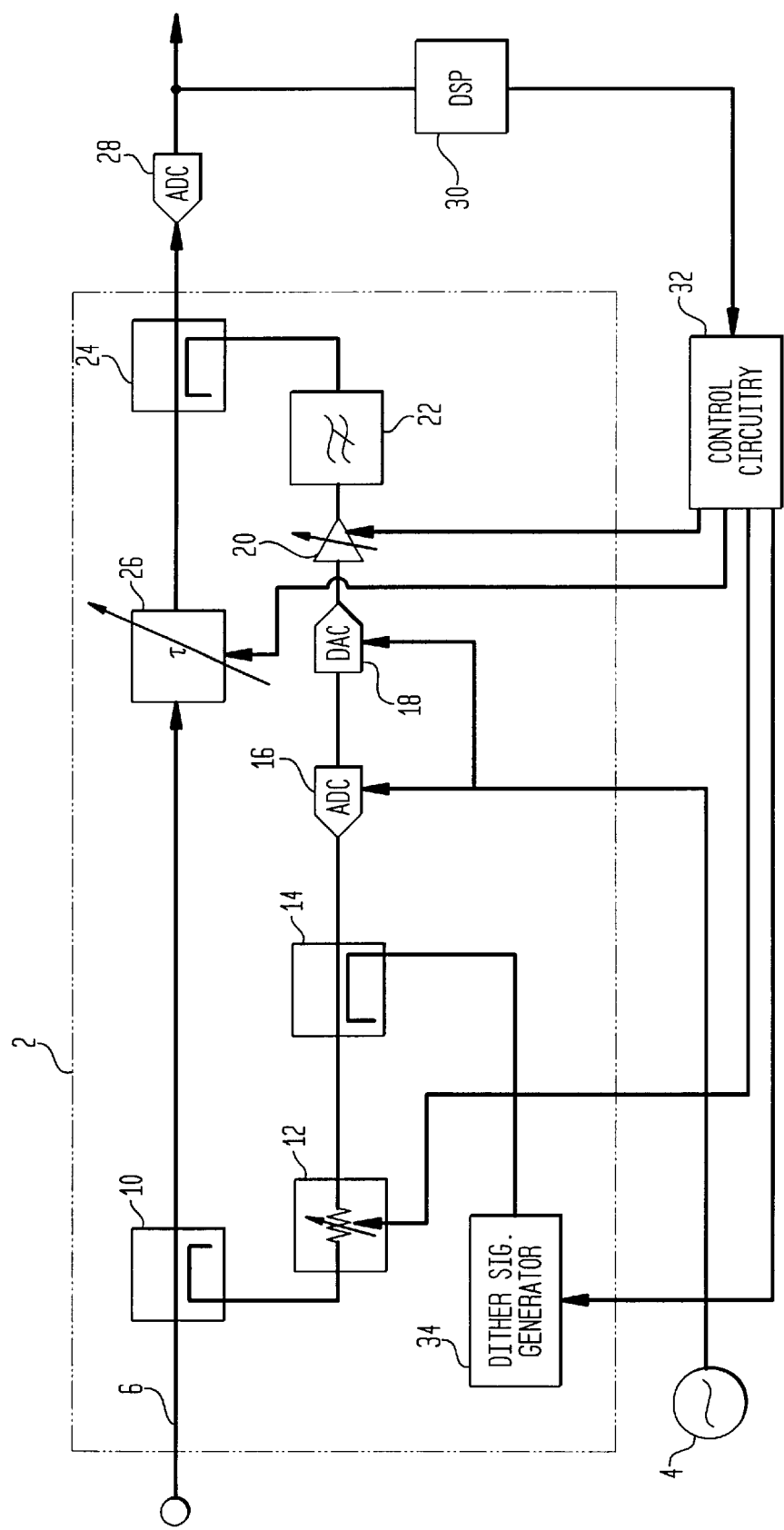
FIG. 1 illustrates an embodiment of a high-power selective signal attenuator according to the present invention.

FIG. 1 illustrates a high-power selective signal attenuator according to an embodiment of the present invention. As shown, the high-power selective signal attenuator 2 selectively attenuates analog main signals received at an input, and supplies the resulting attenuated main signals to the input of a primary ADC 28. The high-power selective signal attenuator 2 operates based on a clock signal received from a converter clock 4 and control inputs received from control circuitry 32. The control circuitry 32 generates the control inputs based on processing performed by a signal processor 30 on the output of the primary ADC 28.

As further shown in FIG. 1, the high-power selective signal attenuator 2 includes a primary pathway 6 and a feed forward pathway 8. The primary pathway 6 includes a delay 26 between a first coupler 10 and a second coupler 24. The first coupler 10 couples the main signals on the primary pathway 6 onto the feed forward pathway 8. An attenuator 12 attenuates the signals on the feed forward pathway 8, and a secondary ADC 16 analog-to-digital converts the output of the attenuator 12. A digital-to-analog convertor (DAC) 18 converts the output of the secondary ADC 16 to analog, and an amplifier 20 amplifies the output of the DAC 18. The second coupler 24 couples the signals on the feed forward pathway 8 back onto the primary pathway 6.

As further shown in FIG. 1, the high-power selective signal attenuator 2 optionally includes a dither signal generator 34, a third coupler 14, and a dither signal remover 22. The dither signal generator 34 generates a low frequency dither signal at an amplitude controlled by the control circuitry 32, and the dither signal is coupled onto the feed forward pathway 8 by the third coupler 14 disposed after the attenuator 12. The dither signal remover 22 removes the dither signal and is disposed after the amplifier 20. The attenuator 12, the amplifier 20, the delay 26 and the dither signal generator 34 operate based on control inputs received from the control circuitry 32. Furthermore, the secondary ADC 16 and the DAC 18 operate according to a clock signal received from the converter clock 4.

The operation of the high-power selective signal attenuator according to the embodiment of the present invention illustrated in FIG. 1 will now be described with reference to FIG. 1 and FIGS. 2A–2B. The high-power selective signal attenuator 2 attenuates analog signals having amplitudes greater than the maximum power level of the dynamic range of the primary ADC 28. To do this, analog signals exceeding the maximum power level are isolated by circuitry in the feed forward pathway 8 of the high-power selective signal attenuator 2, amplitude adjusted, and then combined with the main signals on the primary pathway 6 to selectively cancel portions of these high amplitude (i.e., high power) signals from the main signals.

Specifically, the first coupler 10 couples the analog main signals from the primary pathway 6 onto the secondary pathway 8. The attenuator 12 attenuates the coupled signals to an amplitude less than a power-level threshold established by the control circuitry 32. As discussed in more detail below, the control circuitry 32 adjusts the power level threshold of the attenuator 12 such that the amplitudes of the coupled signals exceeding the maximum power level in the dynamic range of the secondary ADC 16 fall within the dynamic range of the secondary ADC 16. Namely, the power-level threshold is less than or equal to the maximum power level. As a result of this attenuation operation, some signals which fell within the dynamic range of the secondary ADC 16 prior to attenuation, will no longer fall within the dynamic range of the secondary ADC 16.

Figure 2A:
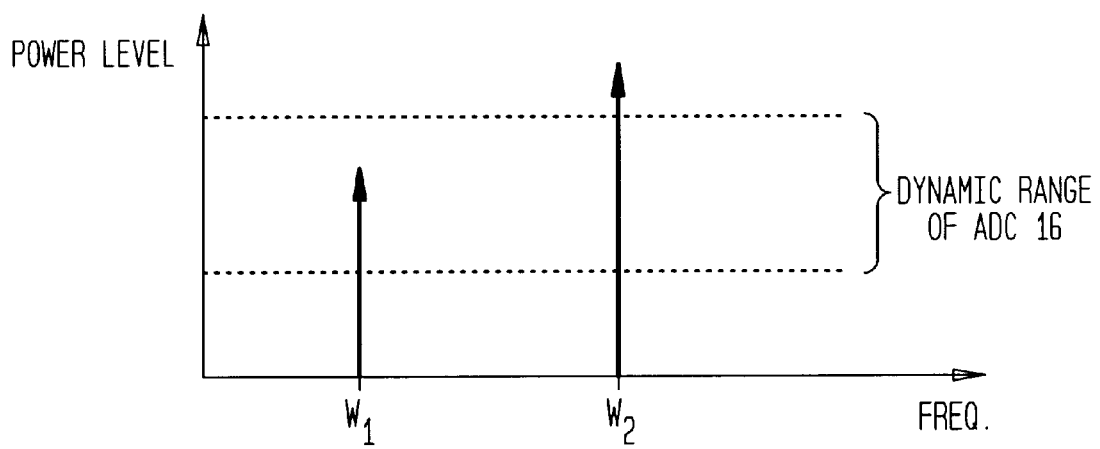
FIG. 2A illustrates the coupled signals prior to attenuation.
Figure 2B:
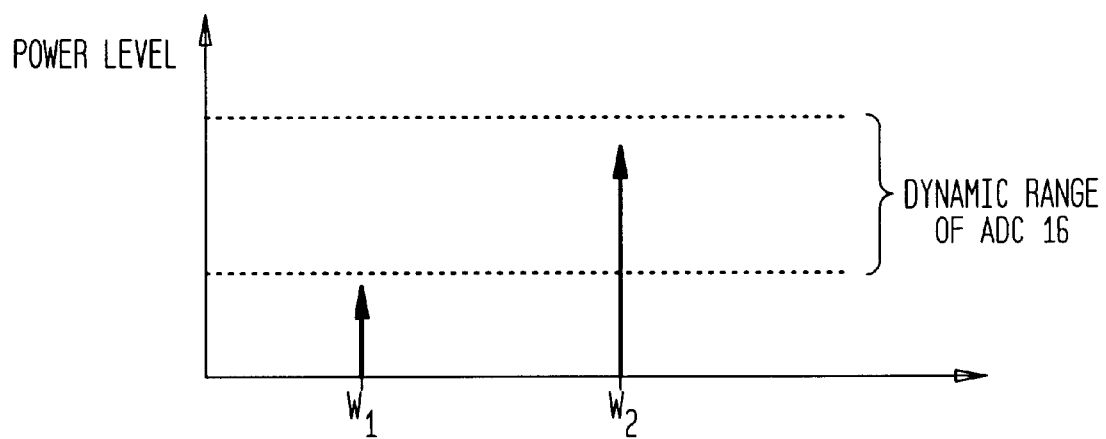
FIG. 2B illustrates the coupled signals after attenuation.

The attenuation operation is clearly illustrated in FIGS. 2A and 2B. FIG. 2A illustrates the amplitude of coupled signals at frequencies W1 and W2 prior to attenuation. As shown, the amplitude of the coupled signal at frequency W1 falls within the dynamic range of the secondary ADC 16, while the amplitude of the coupled signal at frequency W2 exceeds the dynamic range. FIG. 2B illustrates the amplitudes of the coupled signals at frequencies W1 and W2 after attenuation. As shown in FIG. 2B, the amplitude of the coupled signal at frequency W1 now falls below the dynamic range of the secondary ADC 16, while the amplitude of the coupled signal at frequency W2 now lies within the dynamic range of the secondary ADC 16.

The secondary ADC 16 converts the analog coupled signals into digital signals. Specifically, only those frequencies having amplitudes falling within the dynamic range of the ADC will undergo conversion. As such, frequency W2 will be converted, while frequency W1 will not; hence, the information pertaining to frequency W1 is lost.

Digital signals output by the secondary ADC 16 are converted back to analog by the DAC 18, and the amplitudes of the analog signals output from the DAC 18 are amplified by the amplifier 20. The gain of the amplifier 20 is controlled by the control circuitry 32 so that the amplitude of the signals coupled back onto the primary pathway 6 by the second coupler 24 are substantially equal to the amplitudes of the same signals prior to being coupled onto the feed forward pathway 8 by the first coupler 10. Namely, the amplifier 20 cancels out attenuation of the main signals caused by the first coupler 10, the attenuator 12, the third coupler 14 (if present), the secondary ADC 16, the DAC 18, the dither signal remover 22 (if present) and the second coupler 24. Because the power-level threshold of the attenuator 12 dynamically changes, the control circuitry 32 dynamically changes the gain of the amplifier 20 in association therewith.

As discussed above, the second coupler 24 then couples the output of the amplifier 20 back onto the primary pathway 6 such that the signals coupled from the feed forward pathway 8 onto the primary pathway 6 are 180° out of phase with the main signals on the primary pathway 6. Depending upon phase differences generated by the components on the feed forward pathway 8, (including the first and second couplers 10 and 24), the delay 26 delays the main signal to establish a phase difference of 180° between the signals being coupled onto the primary pathway 6 by the second coupler 24 and the main signals output from the delay 26 on the primary pathway 6.

Because the signals being coupled onto the primary pathway 6 mostly include the high power signals, which are 180° out of phase with the high power signals in the main signals, these high-power signals are substantially canceled from the main signals.

Next, the optional dither signal generation will be described followed by a description of the dynamic control of the high-power selective signal attenuator 2 by the control circuitry 32.

The use of a dither signal to improve the operation of ADC is well-known in the art. Therefore, the conceptual underpinning behind the use of dither signals will not be described. Instead, only the insertion and removal of the dither signal in the high-power selective signal attenuator 2 will be described. As shown in FIG. 1, the dither signal generator 34 generates a low frequency dither signal at an amplitude controlled by the control circuitry 32 as described below, and the dither signal is coupled onto the feed forward pathway 8 by a third coupler 14. The addition of the dither signal influences and improves the operation of the secondary ADC 16. After the analog signal output from the DAC 18 is amplified by the amplifier 20, the dither signal remover 22 removes the dither signal from the feed forward pathway 8. In this manner, the operation of the secondary ADC 16 is improved.

While the power-level threshold of the attenuator 12 and the gain of the amplifier 20 could be set to fixed values, the main signals for conversion from analog-to-digital by the primary ADC 28 change over time, and could eventually cause saturation of the primary ADC 28 absent some type of dynamic control of the attenuation operation performed by the high-power selection signal attenuator 2. By monitoring the output of the primary ADC 28, it is determined whether or not the output of the high-power selective signal attenuator 2 is approaching levels which would cause saturation of the primary ADC 28, or alternatively, fall to such levels that the primary ADC 28 is failing to convert a substantial amount of the information in the main signals.

To dynamically control the operation of the high-power selective signal attenuator 2, a signal processor 30 performs a frequency analysis on the output of the primary ADC 28. For instance, the signal processor 30 performs a fast Fourier transform (FFT) on the output of the primary ADC 28 and sums the power in the various frequency bins of the FFT to obtain a total power. The control circuitry 32 includes an empirically determined lookup table to map the total power to a desired power-level threshold for the attenuator 12, gain for the amplifier 20, and optionally, amplitude of the dither signal. One skilled in the art will readily appreciate from the foregoing example that many different types of analysis can be performed on the output of the primary ADC 28 to determine whether or not the primary ADC 28 is approaching saturation or, in the opposite, so far from saturation that the main signals can be amplified to increase the amount of information falling within the dynamic range of the primary ADC 28.

Besides the power-level threshold of the attenuator 12, the delay through the delay 26 affects how well high power signals are cancelled from the main signals. The time it takes to process signals through the feed forward pathway 8 varies with the frequency of the signals being processed. Accordingly, the phase difference between the signals coupled onto the primary pathway 6 by the second coupler 24 and the signals on the primary pathway 6 output by the delay 26 can deviate from 180 degrees and cause imperfect cancellation. This can result in the primary ADC 28 approaching saturation.

Therefore, in addition to dynamic control of the attenuator 12 and the amplifier 20, the control circuitry 32 dynamically controls the delay through the delay 26. In one embodiment, the control circuitry 32 receives the FFT performed by the signal processor 30, and identifies a frequency bin having a power level exceeding a predetermined threshold indicating that the primary ADC 28 is approaching saturation. The control circuitry 32 then incrementally increases the delay through the delay 26, and monitors the power for the identified frequency bin after each increment. If the power in the identified frequency bin decreases, the control circuitry 32 continues incrementing the delay through the delay 26 until there is no longer a decrease in the power of the identified frequency bin. If, instead of a decrease, incrementing the delay through the delay 26 causes an increase in the power of the identified frequency bin, the control circuitry 32 begins incrementally decreasing the delay through the delay 26. If the power in the identified frequency bin decreases, the control circuitry 32 continues decreasing the delay through the delay 26 until there is no longer a decrease in the power of the identified frequency bin. If decreasing the delay through the delay 26 also fails to cause a decrease in the power of the identified frequency bin, the control circuitry 32 restores the delay through the delay 26 to the initial value prior to attempting dynamic control.

A similar operation can also be performed with respect to the gain of the amplifier 20 to account for inaccuracies in the correlation between the gain of the amplifier and the attenuation caused by the other elements in the feed forward pathway 8.

The control circuitry 32 can perform dynamic control of the attenuator 12 (and in conjunction, the amplifier 20), the delay 26, and the amplifier 20 sequentially, in parallel, at different time intervals, etc. It is expected that each individual designer will make use of the dynamic control functions in different ways to optimize the performance of the system being designed.

As demonstrated above, the high-power selective signal attenuator according to the present invention attenuates high-power signals so that an ADC connected thereto will not be placed in saturation. Additionally, the high-power selective signal attenuator is dynamically controlled so that the maximum amount of information is transferred to the ADC without placing the ADC in saturation.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A high-power selective signal attenuator, comprising:
   an attenuator attenuating analog main signals;
   a first analog-to-digital converter (ADC) converting analog output of said attenuator to digital;
   a digital-to-analog converter (DAC) converting digital output of said first ADC to analog; and
   a cancellor receiving said main signals and said analog output from said DAC, and canceling said analog output of said DAC from said main signals.

2. The attenuator of claim 1, wherein
   said first ADC converting said analog output of said attenuator within a power range to digital, said power range defined by a maximum and a minimum power level; and
   said attenuator attenuates said main signals so that power levels greater than a power-level threshold are attenuated below said power-level threshold, and said power-level threshold is less than or equal to said maximum power level.

3. The attenuator of claim 1, further comprising:
   a coupler coupling a portion of said main signals from a transmission line; and wherein
   said attenuator attenuates output from said coupler.

4. The attenuator of claim 2, further comprising:
   a controller controlling said power-level threshold.

5. The attenuator of claim 4, wherein said controller controls said power-level threshold based on output from a main ADC operating on output of said cancellor.

6. The attenuator of claim 4, further comprising:
   an amplifier amplifying said analog output of said DAC prior to receipt by said cancellor; and wherein
   said controller controls a gain of said amplifier in association with control of said power-level threshold.

7. The attenuator of claim 6, further comprising:
   a first coupler coupling said main signals;
   a second coupler coupling output of said amplifier onto said main signals; and wherein
   said attenuator attenuates output of said first coupler; and
   said amplifier amplifies said analog output of said DAC to compensate for attenuation caused by at least said attenuator, said first coupler and said second coupler.

8. The attenuator of claim 4, further comprising:
   a dither signal generator generating a dither signal;
   a combiner combining said dither signal with said analog output of said attenuator;
   a filter filtering out said dither signal from said analog output of said DAC; and wherein
   said controller controls an amplitude of said dither signal.

9. The attenuator of claim 1, wherein said cancellor includes a coupler coupling said analog output of said DAC to said main signals such that said analog output of said DAC is one-hundred eighty degrees out of phase with said main signals.

10. The attenuator of claim 1, further comprising:
    a delay delaying said main signals prior to receipt by said cancellor; and
    a controller controlling a delay time through said delay based on output from a main ADC operating on output of said cancellor.

11. The attenuator of claim 1, further comprising:
    a dither signal generator generating a dither signal;
    a combiner combining said dither signal with said analog output of said attenuator; and
    a filter filtering out said dither signal from said analog output of said DAC.

12. A method of selectively attenuating high-power signals, comprising:
    attenuating analog main signals;
    first converting analog output of said attenuator to digital;
    second converting digital output of said first converting step to analog; and
    canceling said analog output of said second converting step from said main signals.

13. The method of claim 12, wherein
    said first converting step converts said analog output of said attenuating step within a power range to digital, said power range defined by a maximum and a minimum power level; and
    said attenuating step attenuates said main signals so that power levels greater than a power-level threshold are attenuated below said power-level threshold, and said power-level is less than or equal to said maximum power level.

14. The method of claim 13, further comprising:

controlling said power-level threshold.

15. The method of claim 14, wherein said controlling step controls said power-level threshold based on output from a main analog-to-digital converter operating on output of said canceling step.

16. The method of claim 15, further comprising:

amplifying said analog output of said second converting step prior to said canceling step; and wherein said controlling step controls a level of said amplification in association with control of said power-level threshold.

17. The method of claim 15, further comprising:

generating a dither signal;

combining said dither signal with said analog output of said attenuating step;

filtering out said dither signal from said analog output of said second converting step; and wherein said controlling step controls an amplitude of said dither signal based on control of said power-level threshold.

18. The method of claim 12, further comprising:

delaying said main signals prior to operation of said canceling step; and controlling a delay time of said delay step based on output from a main analog-to-digital converter operating on output from said canceling step.

19. The method of claim 12, further comprising:

generating a dither signal;

combining said dither signal with said analog output of said attenuating step;

filtering out said dither signal from said analog output of said second converting step.

* * * * *